United States Patent [19]

Avramopoulos et al.

[11] Patent Number: 5,208,705
[45] Date of Patent: May 4, 1993

[54] OPTICAL LINEAR FEEDBACK SHIFT REGISTER

[75] Inventors: Hercules Avramopoulos, Red Bank; Alan Huang, Middletown; Norman A. Whitaker, Jr., Atlantic Highlands, all of N.J.

[73] Assignee: AT&T Bell Laboratories, Murray Hill, N.J.

[21] Appl. No.: 787,985

[22] Filed: Nov. 5, 1991

[51] Int. Cl.[5] .......................................... H04B 10/12
[52] U.S. Cl. ............................... 359/173; 356/345; 385/16
[58] Field of Search .............. 359/140, 158, 173, 188, 359/195, 243, 320; 385/24, 16, 17; 356/345, 350

[56] References Cited

U.S. PATENT DOCUMENTS

| | | | |
|---|---|---|---|
| 4,717,256 | 1/1988 | Ensley | 356/350 |
| 4,761,050 | 8/1988 | Byron | 350/96.15 |
| 4,761,060 | 8/1988 | Sawano | 385/17 |
| 4,898,468 | 2/1990 | Udd | 356/345 |
| 4,923,267 | 5/1990 | Sa | 385/16 |
| 4,952,791 | 8/1990 | Hinton | 250/211 J |
| 4,961,621 | 10/1990 | Su | 385/16 |
| 4,962,987 | 10/1990 | Doran | 350/96.15 |
| 4,973,122 | 11/1990 | Cotter et al. | 350/96.15 |
| 4,995,690 | 2/1991 | Islam | 350/96.15 |
| 5,046,848 | 9/1991 | Udd | 356/345 |
| 5,093,565 | 3/1992 | Lentine | 250/213 A |
| 5,144,375 | 9/1992 | Gabriel | 356/350 |

OTHER PUBLICATIONS

"Ultrafast switching with a single-fiber interferometer," M. J. LaGasse, et al., *Optics Letters*, vol. 14, No. 6, Mar. 15, 1989).
"Ultrafast, low power, and highly stable all-optical switching in an all polarization maintaining fiber Sagnac interferometer," M. Jinno, et al., (Apr. 1990).
"Soliton switching in a fiber nonlinear loop mirror," M. N. Islam et al., *Optics Letters*, vol. 14, No. 15, (Aug. 1, 1989).
"Optical fiber switch employing a Sagnac interferometer," M. C. Farries, et al, *Appl. Phys. Lett.* 55(1), (Jul., 1989).
"All optical cascadable NOR gate with gain", M. N. Islam, *Optics Letters*, vol. 15, No. 8, Apr., 1990).
"Pulsed-mode laser Sagnac interferometry with applications in nonlinear optics and optical switching," Y. Li, et al, *Applied Optics*, vol. 25, (Jan. 1986).
Ultrafast all-optical logic operations in a nonlinear Sagnac interferometer with two pump pulses, *Optical Fiber Communication*, (OFC) '91, by M. Jinno and T. Matsumoto.

*Primary Examiner*—Edward L. Coles, Sr.
*Assistant Examiner*—L. Pascal
*Attorney, Agent, or Firm*—John A. Caccuro

[57] ABSTRACT

An optical linear feedback shift register arrangement includes an optical encoding means implemented using a modified Sagnac switch. The encoding means encodes a received optical clock signal with a value derived from an exclusive-or of a first and second delayed version of an encoded signal received, respectively, at a first and second control ports. The resulting encoded clock signal, appearing at an output port, is then coupled through a first delay means to said first control port and coupled through a second delay means to said second control port. In another arrangement, an optical communication system utilizes the above-described linear feedback shift register to encode a data signal at a transmitter location and uses an identical linear feedback shift register at the receiver location to decode the encoded data signal.

26 Claims, 3 Drawing Sheets

OPTICAL LINEAR FEEDBACK SHIFT REGISTER

CROSS-REFERENCE TO RELATED APPLICATION

Related subject matter is disclosed in the following applications filed concurrently herewith and assigned to the same assignee hereof: U.S. patent application Ser. No. 787,988, now U.S. Pat. No. 5,155,779 entitled "Optical Circulating Shift Register" inventors Hercules Avramopoulos, M. Christina Gabriel, Alan Huang and Norman Ashton Whitaker, Jr.; and U.S. patent application Ser. No. 787,989, entitled "Optical Crossbar Exchange Arrangement", inventors Alan Huang and Norman Ashton Whitaker, Jr.

BACKGROUND OF THE INVENTION

This invention relates to optical digital circuits and, more particularly, to an optical linear feedback shift register.

All-optical information processing holds promise for processing throughput rates which are much faster than electronics. Despite its relatively weak nonlinear index, silica optical fiber remains the most promising medium for realizing all-optical processing systems. The loss is low enough that extremely long lengths can be used to compensate for the weak nonlinearity, and there is vast amount of existing technology that can be exploited in building a system. All-optical fiber Sagnac interferometer switches have been demonstrated in a number of different formats, and at extremely high speeds. Such Sagnac switches are extremely simple structures which are also immune to fluctuations in ambient conditions, and much experience has been accumulated in the development of Sagnac-based fiber optic gyroscopes.

To build an optical three-terminal Sagnac switch, a control beam must be used which is isolated from a separate signal beam. Two distinct optical wavelengths can be used, in which case lossless combination and separation of the control and signal can be effected using wavelength dependent couplers or filters. While the use of different wavelengths is an elegant scheme for a simple system, the complexity grows as the system grows in complexity, because identical devices of this type cannot be cascaded. Recently, a polarization-based Sagnac switch was demonstrated, in which polarization rather than wavelength was used to distinguish the control beam from the signal beam. Stable polarization-based interferometry is achieved in a Sagnac switch by using polarizing couplers.

Notwithstanding the progress made in implementing optical switches, before an all-optical information processing apparatus becomes a reality, a number of other electronic circuit functions need to be implemented in an optical environment.

SUMMARY OF THE INVENTION

In accordance with the present invention, an optical linear feedback shift register arrangement is implemented using an optical encoding means. The encoding means encodes a received optical clock signal with a value derived from an exclusive-or of the first and second delayed versions of an encoded signal received, respectively, at first and second control ports. The resulting encoded clock signal, appearing at an output port, is then coupled through a first delay means to said first control port and coupled through a second delay means to said second control port.

In another arrangement, an optical communication system utilizes the above-described linear feedback shift register to encode a data signal at a transmitter location and uses an identical linear feedback shift register at the receiver location to decode the encoded data signal.

DETAILED DESCRIPTION

Figure 1:
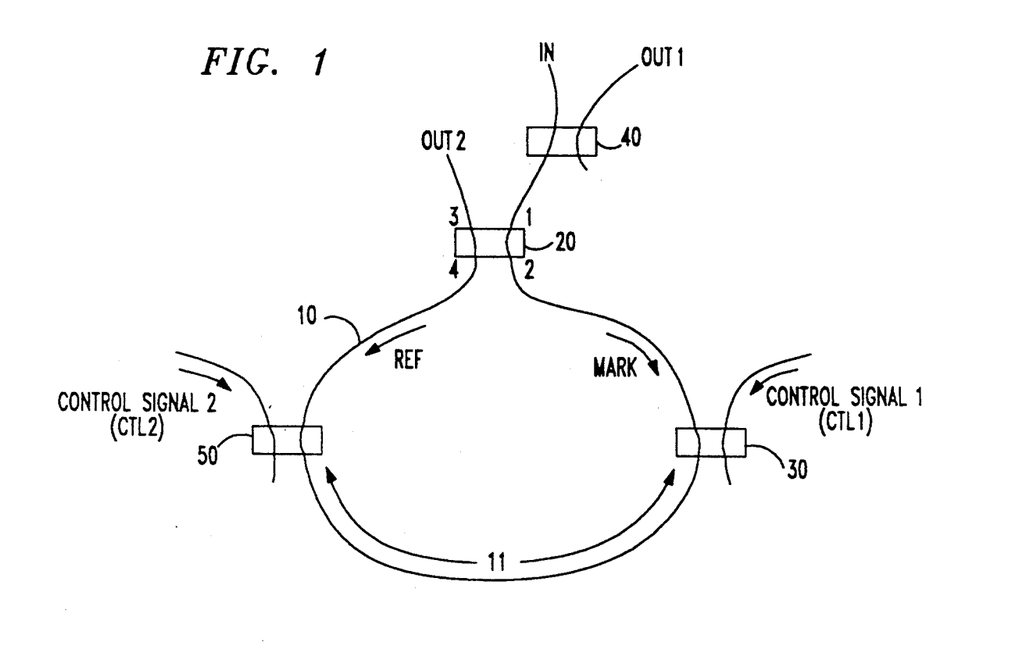
FIG. 1 shows an illustrative optical exclusive-or gate implemented using a Sagnac switch.

Before describing the present invention, we first describe the operation of an optical exclusive-or logic gate of FIG. 1 which may be utilized in the present invention. An optical exclusive-or logic gate 100 may be implemented using a Sagnac interferometer switch arrangement 110 (hereinafter Sagnac switch) modified to include two control inputs. Such a Sagnac switch is described in more detail in the co-pending U.S. patent application Ser. No. 07/521,774 of Gabriel, Houh and Whitaker entitled "Sagnac Optical Logic Gate," filed May 10, 1990, which is incorporated by reference herein.

The Sagnac switch, illustratively, includes an optical transmission medium, i.e., an optical fiber 10, that is connected at both ends to a coupler 20. An input signal is applied to an input IN, which is coupled through coupler 40, to port 1 of coupler 20. Coupler 40 also enables a reflected output appearing at port 1 of coupler 20 to be coupled to output OUT1. Ports 2 and 4 of coupler 20 are connected to the two ends of fiber 10. Port 3 of coupler 20 forms a second output OUT2 of the Sagnac switch.

Fiber 10 forms a loop, (also referred to herein as fiber loop 10) which in the context of this disclosure, refers to the path over which a signal travels and, more particularly, to arrangements where the path forms a closed, or nearly closed, figure.

The Sagnac switch operates as follows. An input signal IN applied to port 1 is split into two parts that exit coupler 20 at ports 2 and 4: a "mark" signal that travels clockwise, and a "ref" signal (reference signal) that travels counterclockwise. The "mark" and "ref" signals travel through the loop in opposite directions, re-enter coupler 20 and recombine therein. Under normal circumstances, the "mark" and "ref" signals experience the same conditions as they travel through the loop. Even though the propagation speed is a function of many parameters that may be uncontrollable and may or may not change with time, the travel time of the "ref" and "mark" signals is short enough that, basically, all of the parameters remain static. Consequently, no changes occur within the loop to differentiate between the effects of the fiber on the signals traveling in the two directions. The result is a combining of the "ref" and "mark" signals in coupler 20 that is constructive with respect to port 1 and destructive with respect to port 3. In consequence, light that enters port 1 of the coupler 20 is completely reflected back to port 1 (and appears as OUT1 of coupler 40), and no output is delivered to port 3 (OUT2).

In addition to the above-described structure, FIG. 1 includes a coupler 30 that injects a first control signal CTL1 into a segment 11 of the fiber loop 10. Because coupler 30 is within the loop, the control signal CTL1 travels along the loop only in one direction; and more specifically, coupler 30 is arranged to inject the control signal that travels along the loop in the clockwise direction of the "mark" signal. Similarly, coupler 50 injects a second control signal CTL2 into segment 11 of the fiber loop 10 in the same counter-clockwise direction as the "ref" signal.

When a control pulse is sent into loop 10, it is timed with respect to the input generated pulse (reference or interacting pulse) so that the pulse that propagates faster is preceded by the pulse that propagates slower. While propagating through the loop, the faster pulse overtakes and completely surpasses the slower pulse, causing the two pulses to traverse each other. (It should be kept in mind that the term "traverse" is used in a bilateral sense. When pulse A traverses pulse B, pulse B also traverses pulse A.) In this manner, the control pulse affects the propagation speed of the pulse sent in the same direction through the Sagnac loop and modifies the phase of the affected pulse as it re-enters the coupler 20. When the intensity of the control pulse is properly controlled, the phase shift caused by the control pulse (on the pulse sent in the control pulse direction) is such that no reflected signal appears at the input port 1 of the coupler 20.

Segment 11 of fiber 10 is a variable refractive-index material that is characterized by the property that the propagation speed of a light beam passing through the material is a function of the energy of the beam that passes through the material. Furthermore, not only does the propagation speed change for the beam that effects the change in propagation speed, but it also changes the propagation speed of other beams that pass through the material at the same time. Of course, the entire length of fiber 10 may be made of such a variable refractive-index material, but for the sake of generality, FIG. 1 is drawn with only a limited segment being made up of this material. Also for the sake of generality, it should be pointed out that the loop of fiber 10 in FIG. 1 does not necessarily have to be fiber. It can be a waveguide or other means for directing the flow of light.

Thus, the arrangement of FIG. 1 includes a fiber loop 10 having a controllable propagation speed material in segment 11, "mark" and "ref" signals traveling through the loop in opposite directions and combined in coupler 20, a first control signal CTL1 that is injected at coupler 30 which travels in the same direction as the "mark" signal, and a second control signal CTL2 that is injected at coupler 50 and which travels in the same direction as the "ref" signal. When either or both control signals CTL1 and CTL2 are present and properly timed relative to each other and to the input signal IN, the circuit of FIG. 1 provides an exclusive-or function on the control signals CTL1 and CTL2.

Figure 2:
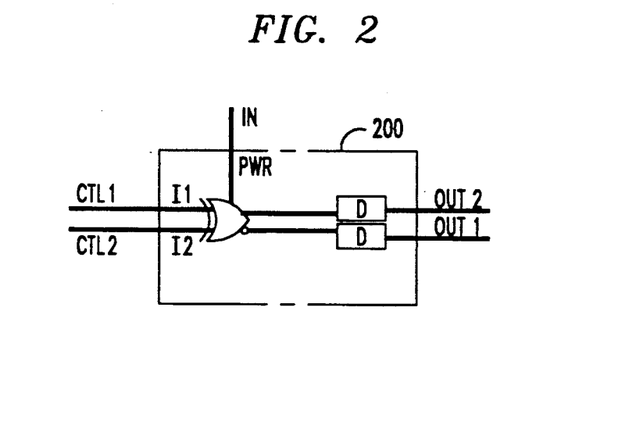
FIG. 2 shows a schematic exclusive-or gate equivalent of FIG. 1.

With reference to FIG. 2, we illustrate a standard exclusive-or gate representation of our circuit of FIG. 1. The exclusive-or function requires that if both input signals I1 and I2 are absent (logic 0) or present (logic 1), then the output OUT is absent (logic 0). However, if either input signal I1 or I2 is present (logic 1), then the output OUT is present (logic 1). As will be described below the circuit of FIG. 1 provides the exclusive-or function of FIG. 2 if control signal CTL1 is defined as input I1, control signal CTL2 is defined as input I2, OUT2 is the non-inverted output and OUT1 is the inverted output. The input IN of FIG. 1 is, illustratively, shown as the power lead of FIG. 2. While a dc voltage is used to power an electronic exclusive-or gate, our optical version requires a pulse stream (e.g., a clock) to "power" it. The inherent delay of our optical logic gate of FIG. 1 is represented by the delay elements D of FIG. 2. For convenience we define the delay D to be equal to one clock period. Thus, the outputs OUT 2 and OUT 1 are delayed by one clock period from the inputs I1 and I2. It should be noted that since the delay D is determined by the length of fiber loop 10, it can be adjusted to be any prespecified time interval.

The detailed exclusive-or type operation of the circuitry of FIG. 1 is described in detail below. In the following description we assume that the control pulses CTL1 and CTL2 are approximately the same shape (although as discussed later only the overall energy of the control signals CTL1 and CTL2 need be the same to have the same propagation speed alteration effects).

When both of the control signals CTL1 and CTL2 are absent, the "mark" and "ref" signals are combined in coupler 20 as described above. The signal entering the switch at port 1 reflects out of the loop of fiber 10 and exits out of port 1 of coupler 20 and OUT1 of coupler 40. Thus, no signal appears at port 3 or output OUT2 when both of control signals CTL1 and CTL2 are not present.

However, when only the control signal CTL1 is present (i.e., control signal CTL2 is not present) and is made to traverse the "mark" signal in segment 11, there is a change in propagation speed of the "mark" signal. Thus, the control signal alters the phase of the "mark" signal arriving at coupler 20. When the energy in the control signal and the interaction interval within segment 11 (between the "mark" and control signals) are properly controlled, the "mark" signal undergoes an additional phase shift of about $\pi$ radians (180°), which the opposite traveling "ref" signal doesn't undergo. The resulting 180° phase differential between the "mark" and "ref" signals causes the combining of the "mark" signal and the "ref" signal in coupler 20 to be completely destructive with respect to port 1 and completely constructive with respect to port 3. As a result, all of the energy exits at port 3 (non-reflected signal output port) rather than at port 1 (reflected signal output port). It may be noted in passing that the "ref" signal also passes through segment 11 and that its speed is also somewhat affected by the control signal. But, since the control signal and the "ref" signal travel in opposite directions, their interaction time is much shorter than the interaction time of the "mark" and the control signals.

To ensure the proper operation of the Sagnac switch (that is to minimize the distortion of the pulse which outputs at port 3) requires that the control signal CTLI completely traverse the "mark" signal during its transit through segment 11 of the fiber loop 10. (That is, every part of control signal CTLI interacts with every part of the "mark" signal, as described in detail in the above-identified patent application.) This traversing is accomplished by requiring that the material of segment 11 have a birefringence characteristic, that is, one that propagates the control signal at a different rate than the "mark" signal. Thus, if the control signal CTLI is faster than the "mark" signal, it enters loop 10 behind the "mark" signal and slips past it before the end of segment 11. If the control signal is slower than the "mark" signal, it must enter loop 10 just before the "mark" signal and the "mark" signal must pass it before the end of segment 11.

The difference in the propagation speed between the control signal CTLI and "mark" signal may be tied to any controllable parameter of the control signal, such as wavelength, intensity or polarization. To ensure that the control signal does not interfere with the "mark" signal it should utilize either a different wavelength or the same wavelength and different polarization. As long as the control signal CTL1 completely traverses the "mark" signal within segment 11 the Sagnac switch operation is completely insensitive to the shape of the control signal or its precise timing. Rather, it is only sensitive to the overall energy of the control signal (integral of the control pulse).

In a manner analogous to that described above, when only control signal CTL2 is present (control signal CTL1 being absent), it travels through segment 11 with the "ref" signal. This alters the propagation speed of the "ref" signal relative to the "mark" signal so that the resulting phase differential between the "ref" and "mark" signals is about $\pi$ radians (180°) which causes the combining in coupler 20 to be completely destructive with respect to port 1 and completely constructive with respect to port 3. Thus, when either control signal CTL1 or CTL2 is present, a signal appears at output OUT2 and no signal appears at OUT1.

Finally, when both control signals CTL1 and CTL2 (having comparable energy integrals) are present, then, as described above, the propagation speed of both the "ref" and "mark" signals undergo the same phase shift. The result is that the "ref" and "mark" signal transit the fiber loop 10 at the same altered speed and with little differential phase difference between them. Consequently, this causes their combining in coupler 20 to be completely constructive with regard to port 1 and completely destructive with regard to port 3. Thus, when both control signals CTL1 and CTL2 are present a signal appears at output OUT1 and no signal results at output OUT2.

Thus, output lead OUT 2 of the circuit of FIG. 1 exhibits an exclusive-or function of the control signals CTL1 and CTL2. This is shown in FIG. 2. If an exclusive-nor function is desired, then the output OUT 1 is used rather than OUT 2, as also shown in FIG. 2.

Figure 3:
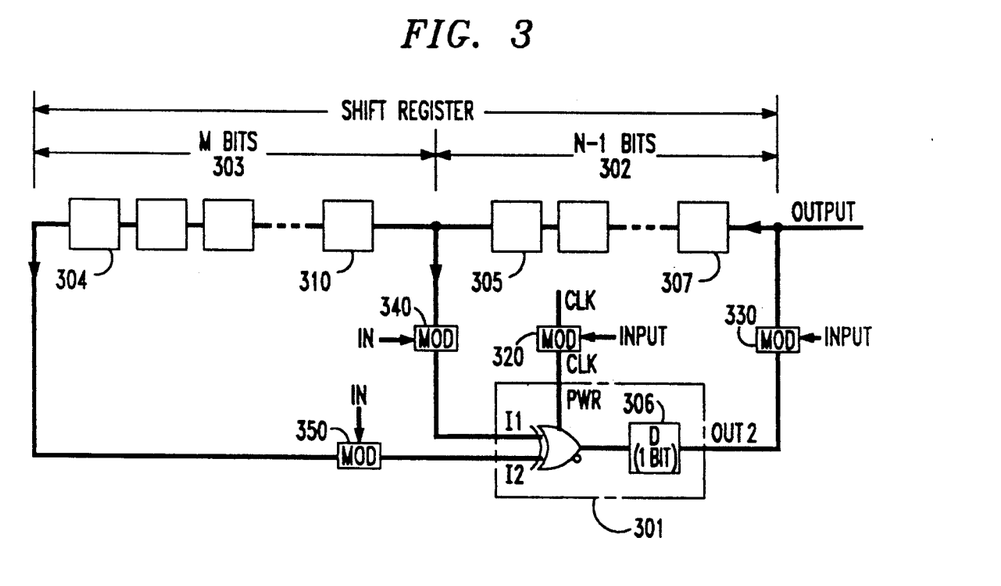
FIG. 3 shows an illustrative optical linear feedback shift register arrangement in accordance with the present invention.

With reference to FIG. 3 we describe an all-optical linear feedback shift register arrangement, in accordance with the present invention, implemented using the optical exclusive-or logic gate of FIG. 1. The linear feedback shift register of FIG. 3 includes an exclusive-or logic gate 301 (FIG. 1) having a first length of fiber 302 connected between its output OUT 2 and input I1, and a second length of fiber 303 connected between inputs I1 and I2.

Since the output OUT 2 (and OUT 1, not shown) of exclusive-or gate 301 is generated from the clock signal it has the same wavelength and polarization as the clock signal. The outputs of the first length of fiber 302 and the second length of fiber 303 which become, respectively, input signals to I1 and I2 also have the same wavelength and polarization as the clock signal. However, since inputs IN1 and IN2 are the control ports of the Sagnac switch, proper Sagnac operation requires that they use the orthogonal polarization (since they have the same wavelength) so as not to interfere with the clock signal. Thus, somewhere either at the output OUT 2 or at the inputs IN1 and IN2 the fiber cable connection must be rotated 90° to ensure that the signals to inputs IN1 and IN2 have a different polarization than the clock signal.

The length of fiber 302 and 303 represents a tapped delay line. The fiber 302 and 303 may also be considered as an optical shift register having, respectively, N1 and N2 bits which is clocked at the clock frequency rate CLK. The number of bits N1 and N2, respectively, is determined by the length of fiber 302 and 303, respectively, divided by the length of fiber traveled by a clock pulse during one clock time. Note, while fiber 302 and 303 may be a fiber having a uniform propagation speed it could also be made from the same material as fiber 10 in FIG. 1.

Assuming that the shift register (302, 303) has a predetermined data pattern stored therein (loading of data is described in a subsequent paragraph), the operation of the linear feedback shift register is described as follows. The output bits of shift register location 304 and 305 are input, respectively, to inputs I2 and I1 and generate an output from exclusive-or gate 301 which is stored in delay 306. As noted, we assume that the inherent delay 306 of our exclusive-or gate 301 is equal to a clock period (one bit time). That is, it represents a one bit register which may be considered as part of register 302. One clock period later, the next bits are outputted from stages 304 and 305 are "exclusive-ored" by gate 301 and stored in register 306. The previous bit from register 306 is shifted into location 307 of register 302. The output of register location 305 also is inputted to location 310 of register 303 as well as to input I1 of exclusive-or gate 301. The process continues as described above with the output OUT 2 of gate 301 thus representing a binary sequence.

Data may be entered into the linear feedback shift register of FIG. 3, in a number of ways including 1) modulator 320 placed in series with the clock lead, 2) modulator 330 placed in series with the output lead OUT 2, and 3) modulator 340 or 350 placed in series with the input leads I1 and I2, respectively.

Linear feedback shift registers have many interesting applications, one of them being their ability to generate maximum length pseudorandom binary sequences of 0's and 1's. For example, see P. H. R. Scholefield, "Shift Registers: Generating Maximum Length Sequences," *Electronic Technology*, October 1960, vol. 37, pp. 389–394. These pseudorandom sequences are of length $2^P - 1$, where P corresponds to the size of the shift register being used (P=N+M in our illustrative design). These sequences contain all possible combinations of 0's and 1's defined in the Galois Field (GF) of order $2^P$ except the zero state (all zeroes). These maximum length sequences are generated by primitive polynomials over GF $[2^P]$. Various tables exist with a list of these well-known primitive polynomials and irreducible trinomials over GF $[2^P]$. For example, see W. Stahnke, "Primitive binary Polynomials", *Mathematical Computation*, October 1973, vol. 27, no. 124, pp. 977–980. In our disclosed linear feedback shift register we utilize trinomials in GF $[2^P]$ rather than polynomials to illustrate a design using only one exclusive-or gate.

To obtain a maximal length sequence for a pseudorandom number generator of FIG. 3 the combined length of registers 306 and 302 is selected to store N clock pulses and the length of register 303 selected to store M clock pulses, where M is less than N, and M is determined by an appropriate Pth order primitive trinomial (where P=M+N). These values for M and N are determined in a well-known manner, for example, by reference to the above-recited articles.

Figure 4:
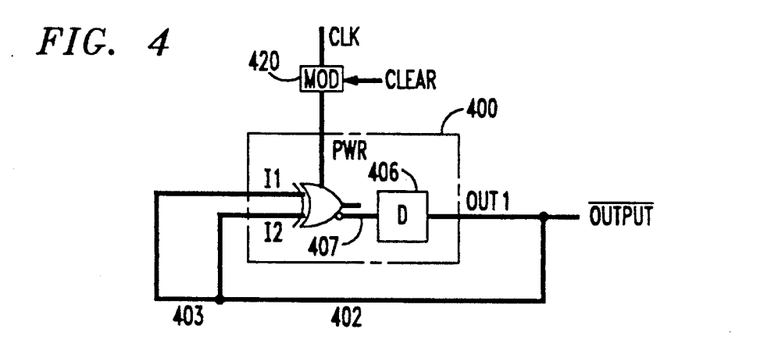
FIG. 4 shows an illustrative linear feedback shift register arrangement having negative feedback.

Shown in FIG. 4 is a linear feedback shift register of FIG. 3 arranged as an exclusive-nor gate 400 (using negative feedback), and having an internal reset (clear circuit). The gate 400 operates in the same manner as gate 300, except that the output is inverted. The modulator 420 is used to clear the contents of shift registers 402 and 403 when the clear lead is logic 1. Modulator 420 is disabled when the clear lead is logic 0.

During the clear mode, the clear lead is logic 1 and the output 407 is logic 0. During this clear mode, the contents of registers 406, 402 and 403, are all sequentially cleared to logic 0. Note, however, that register 406 becomes and stays as logic 1 during the clear mode. After all the registers 402, 403 and 406 are completely cleared, data can then be entered into the linear feedback shift register of FIG. 4 by selectively turning the clear lead to logic 0 to enable clock pulses to enter the linear feedback shift register. Since registers 302 and 303 are cleared, the output 407 is logic 1 and is entered into register 402 and then register 403. After the data has all been entered the clear lead is set to logic 0.

Figure 5:
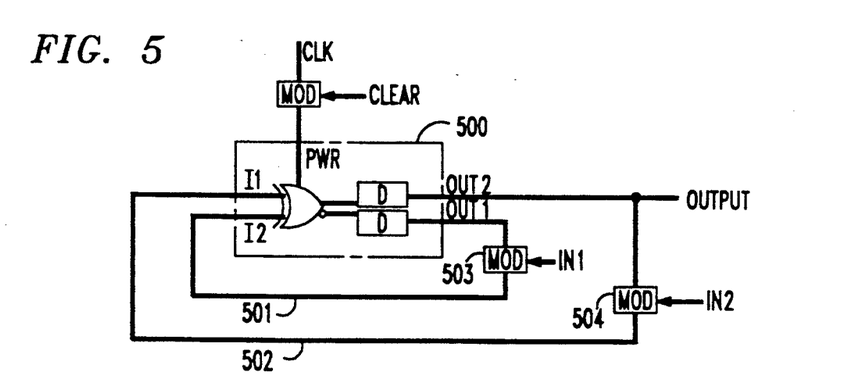
FIG. 5 shows an illustrative optical linear feedback shift register with positive and negative feedback.

With reference to FIG. 5 we describe a linear feedback shift register 500 having both positive and negative feedback and internal reset. When clear lead is logic 1, no clock pulse enters circuit 500 and registers 501 and 502 are cleared. The length of registers 501 and 502 have to be different and are determined using an appropriate primitive trinomial, as previously discussed. Data may be entered into registers 501 and 502 using modulators 503 and 504, respectively.

Figure 6:
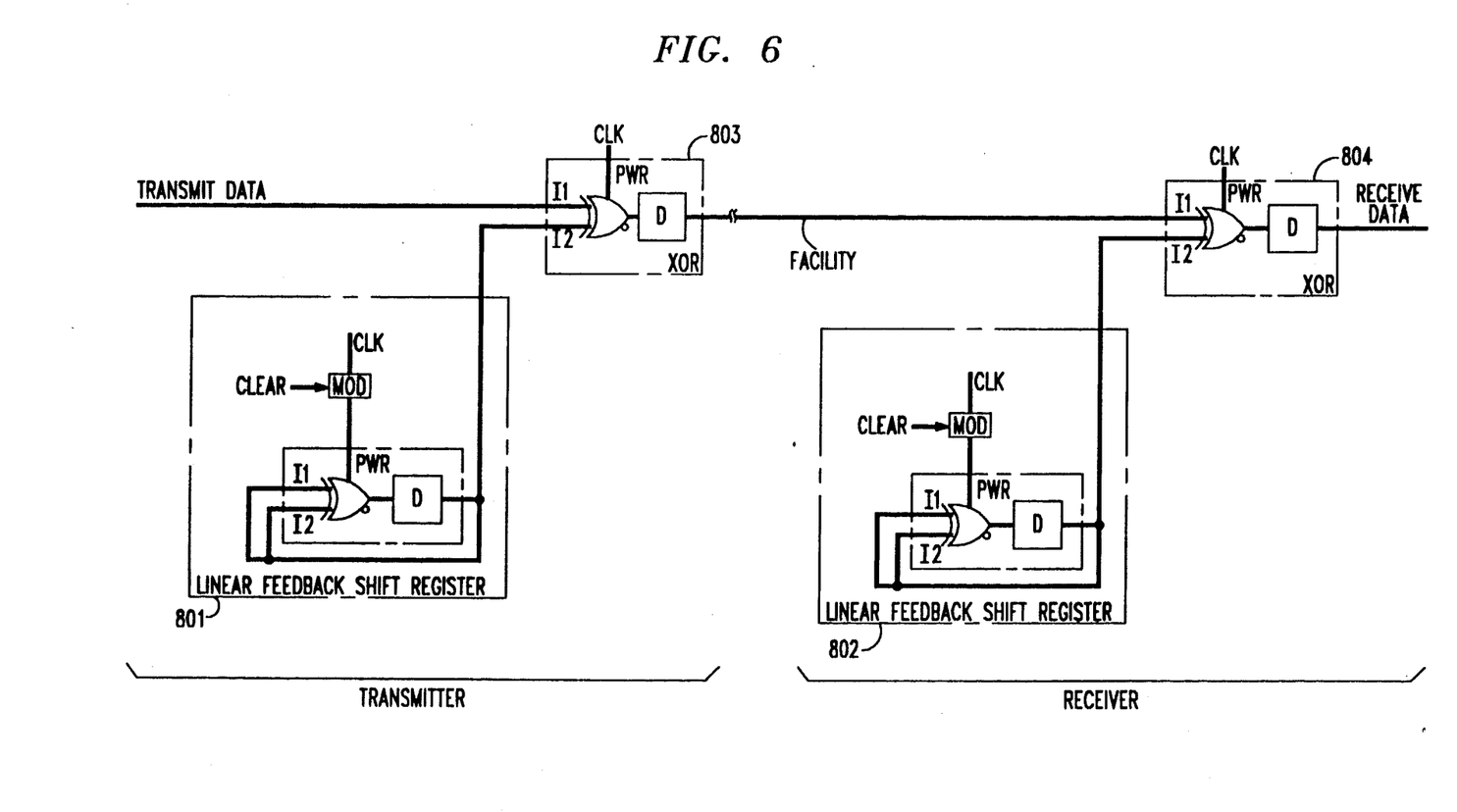
FIG. 6 shows an illustrative communication link implemented using exclusive-or gates of FIG. 1 together with linear feedback shift registers of FIG. 3.

Shown in FIG. 6 is a communication system implemented using identical FIG. 1-type linear feedback shift registers which have the appropriate register size needed to implement identical pseudorandom number generators (601 and 602) for use at the transmitter location and at the receiver locations. Transmit data and the output of pseudorandom number generator 601 are provided as inputs to an encoder, illustratively, implemented using exclusive-or gate 603. The output of exclusive-or gate 603, sent over facility 605, is the transmit data encoded by the pseudorandom sequence outputted from pseudorandom number generator 601. At the receiver location the encoded data signal received over facility 605 is decoded by a decoder, illustratively, implemented using exclusive-or gate 604, using the output of pseudorandom number generator 602 (identical to the output of generator 601). The receive data output of exclusive-or gate 604 is the original transmit data. Obviously, the pseudorandom number generator 601 utilized at the transmitter location may be implemented differently than the pseudorandom number generator 602 used at the receiver location, as long as they are synchronized so that the generated pseudorandom number sequence is the same.

It should be noted that the function of Sagnac switch of FIG. 1 may be implemented using a Mach-Zehnder switch or other interferometer switch, utilizing the Kerr effect, and arranged in an analogous manner as disclosed herein.

What has been described is merely illustrative of the application of the principles of the present invention. Other arrangements and methods can be implemented by those skilled in the art without departing from the spirit and scope of the present invention.

We claim:

1. An optical linear feedback shift register arrangement comprising:
    encoding means utilizing all-optical interaction, including
        means for receiving an optical clock signal,
        first control means for receiving a first delayed version of an encoded optical clock signal,
        second control means for receiving a second delayed version of said encoded optical clock signal,
        means for outputting an encoded optical clock signal,
        wherein said encoding means encodes the clock signal with a value derived from an exclusive-or of said first and second
    delayed encoded clock signals, and wherein a third delay caused by said encoding means from said control means to said output means is a prespecified time interval;
    first delay means for coupling the encoded clock signal from said output means to said first control means, after a first predetermined time interval;
    second delay means for coupling the encoded clock signal to said second control means after a second predetermined time interval.

2. The arrangement of claim 1 wherein said all-optical interaction includes a nonlinear optical process.

3. The arrangement of claim 1 further including means for entering data into the linear feedback shift register.

4. The arrangement of claim 1 further including means for producing a modulated optical clock signal in response to a received data signal.

5. The arrangement of claim 4 wherein said received data signal is a clear signal.

6. The arrangement of claim 1 wherein the first delay means includes means for modulating the encoded clock signal in response to a received data signal.

7. The arrangement of claim 6 wherein said received data signal is a clear signal.

8. The arrangement of claim 1 further including means for inputting a received data signal into one of said first control means and said second control means.

9. The arrangement of claim 1 wherein said encoding means includes a Sagnac switch and wherein
    said receiving means is an input port of said Sagnac switch;
    said first control means is a first control port of said Sagnac switch;
    said second control means is a second control port of said Sagnac switch; and
    said delay means couples an output port of said Sagnac switch to said first control port.

10. The arrangement of claim 1 wherein said clock signal is a plurality of pulses and wherein the pulse rate of said clock signal and the pulse rate of said received data signal are substantially synchronized.

11. The arrangement of claim 1 wherein the time interval between two pulses of said clock signal is substantially equal to said prespecified time interval.

12. The arrangement of claim 1 wherein the combined first predetermined time interval and prespecified time interval can store N pulses and the second predetermined time interval can store M pulses, where M is less than N, and M is determined by an appropriate Pth order primitive trinomial, P=M+N, such that said encoded clock signal is a maximal length sequence.

13. An optical linear feedback shift register comprising:
encoding means utilizing all-optical interaction, including
means for receiving an optical clock signal,
first control means for receiving a first delayed version of an encoded optical clock signal,
second control means for receiving a second delayed version of an inverted copy of said encoded optical clock signal,
first means for outputting said encoded optical clock signal,
second means for outputting said inverted copy of said encoded optical clock signal,
wherein said encoding means encodes the clock signal with a value derived from an exclusive-or of said first delayed encoded clock signal, and said second delayed inverted encoded clock signal, and wherein a third delay caused by said encoding means from said first and second control means to said first output means is a prespecified time interval;
first delay means for coupling the encoded clock signal from said first output means to said first control means after a first predetermined time interval;
second delay means for coupling the inverted encoded clock signal to said second control means after a second predetermined time interval, said second predetermined time delay being longer than said first predetermined time interval; and
register output means for outputting the encoded clock signal.

14. The arrangement of claim 13 wherein said encoding means includes a Sagnac switch and wherein
said receiving means is an input port of said Sagnac switch;
said first control means is a first control port of said Sagnac switch;
said second control means is a second control port of said Sagnac switch;
said first output means is a first output port of said Sagnac switch;
said second output means is a second output port of said Sagnac switch; said second output port having an output which is an inverse of an output of said first output port;
said first delay means couples said first output port of said Sagnac switch to said first control port; and
said second delay means couples said second output port of said Sagnac switch to said second control port.

15. Claim 13 wherein said clock signal is a plurality of pulses and wherein the pulse rate of said clock signal and the pulse rate of said received data signal are substantially synchronized.

16. Claim 13 wherein the time interval between two pulses of said clock signal is substantially equal to said prespecified time interval.

17. Claim 13 wherein one of said delay means can store N pulses and the other of said delay means can store M pulses, where M is less than N, and M is determined by an appropriate Nth order primitive trinomial, P=M+N, such that said encoded clock signal is a maximal length sequence.

18. An optical linear feedback shift registor comprising
an optical transmission medium including controllable propagation speed material;
coupler means including an input port for receiving an input pulse and for injecting it into said medium, to develop an interacting signal that travels in said medium in one direction and a reference signal that travels in said medium in the opposite direction;
first means for injecting a first control pulse into said medium, that travels through said medium in the direction of said interacting signal, with a timing of said first control pulse, in relation to said interacting signal, controlled so that the first control pulse and the interacting signal traverse each other while the interacting pulse is traveling through said controllable propagation speed material;
second means for injecting a second control pulse into said medium, that travels through said medium in the direction of said reference signal, with a timing of said second control pulse, in relation to said reference signal, controlled so that the second control pulse and the reference signal traverse each other while the reference signal is traveling through said controllable propagation speed material,
means for combining said reference signal after its travel through said material and said interacting signal after its travel through said material; and
a second optical transmission medium having a first predefined pulse delay between an input and a first output thereof and having a second output having a second predefined pulse delay, shorter than said first pulse delay, said input of said second medium input coupled to an output port of said combining means and said first output of said second medium coupled to one of said first and said second injecting means, and said second output of said second medium coupled to a different one of said first and second injecting means.

19. An optical linear feedback shift register comprising
a transmission medium including controllable propagation speed material through;
coupler means including an input port for receiving an input pulse and for injecting it into said medium, to develop an interacting signal that travels in said medium in one direction and a reference signal that travels in said medium in the opposite direction;
first means for injecting a first control pulse into said medium, that travels through said medium in the direction of said interacting signal, with a timing of said first control pulse, in relation to said interacting signal, controlled so that the first control pulse and the interacting signal traverse each other while the interacting pulse is traveling through said controllable propagation speed material;
second means for injecting a second control pulse into said medium, that travels through said medium in the direction of said reference signal, with a timing of said second control pulse, in relation to said reference signal, controlled so that the second control pulse and the reference signal traverse each other while the reference signal is traveling through said controllable propagation speed material;

means for combining including first output means for outputting a combined signal obtained by interferometrically combining said reference signal after its travel through said material and said interacting signal after its travel through said material, and second output means for outputting an inverse combined signal;

a second optical transmission medium having a first predefined pulse delay, said second medium coupling said first output means of said combining means to one of said first and second injecting means; and a third optical transmission medium having a second predefined pulse delay different from said first delay, said third medium coupling said second output means of said combining means to a different one of said first and second injecting means.

20. An optical communication system comprising a transmitter including a first optical linear feedback shift register for generating a first signal and a first exclusive-or means for encoding an optical transmit data signal using said first signal to produce an encoded signal;

a receiver including a second optical linear feedback shift register for generating a second signal, identical to said first signal, and a second exclusive-or means for decoding a received encoded signal using said second signal; and wherein at least one of said first and said second shift registers including encoding means utilizing all-optical interaction, including means for receiving an optical clock signal, first control means for receiving a first delayed version of an encoded optical clock signal, second control means for receiving a second delayed version of said encoded optical clock signal, means for outputting said encoded optical clock signal, and wherein said encoding means encodes the clock signal with a value derived from an exclusive-or of said first and second delayed encoded clock signals, and wherein a third delay caused by said encoding means from said control means to said output means is a prespecified time interval;

first delay means for coupling the encoded clock signal from said output means to said first control means, after a first predetermined time interval;

second delay means for coupling the encoded clock signal to said second control means after a second predetermined time interval; and register output means for outputting the encoded clock signal.

21. An optical communication system comprising a transmitter including a first linear feedback shift register for generating a first signal and a first exclusive-or means for encoding an optical transmit data signal using said first signal to produce an encoded signal;

a receiver including a second linear feedback shift register for generating a second signal, identical to said first signal, and a second exclusive-or means for decoding a received encoded signal using said second signal; and wherein at least one of said first and said second shift registers including encoding means utilizing all-optical interaction, including means for receiving an optical clock signal, first control means for receiving a first delayed version of an encoded optical clock signal, second control means for receiving a second delayed version of an inverted copy of said encoded optical clock signal, first means for outputting said encoded optical clock signal, second means for outputting said inverted copy of said encoded optical clock signal, and wherein said encoding means encodes the clock signal with a value derived from an exclusive-or of said first delayed encoded clock signal, and said second delayed inverted encoded clock signal, and wherein a third delay caused by said encoding means from said first and second control means to said first output means is a prespecified time interval;

first delay means for coupling the encoded clock signal from said first output means to said first control means after a first predetermined time interval;

second delay means for coupling the inverted encoded clock signal to said second control means after a second predetermined time interval, said second predetermined time delay being longer than said first predetermined time interval; and register output means for outputting the encoded clock signal.

22. A transmitter for use in an optical communication system, comprising an exclusive-or means for encoding a received optical transmit data signal with a code signal generated by an optical linear feedback shift register and said shift register including encoding means utilizing all-optical interaction, including means for receiving an optical clock signal, first control means for receiving a first delayed version of an encoded optical clock signal, second control means for receiving a second delayed version of said encoded optical clock signal, means for outputting said encoded optical clock signal, and wherein said encoding means encodes the clock signal with a value derived from an exclusive-or of said first and second delayed encoded clock signals, and wherein a third delay caused by said encoding means from said control means to said output means is a prespecified time interval;

first delay means for coupling the encoded clock signal from said output means to said first control means, after a first predetermined time interval;

second delay means for coupling the encoded clock signal to said second control means after a second predetermined time interval; and register output means for outputting the encoded clock signal.

23. A transmitter for use in an optical communication system, comprising an exclusive-or means for encoding a received optical transmit data signal with a code signal generated by an optical linear feedback shift register and said shift register including encoding means utilizing all-optical interaction, including means for receiving an optical clock signal, first control means for receiving a first delayed version of an encoded optical clock signal, second control means for receiving a second delayed version of an inverted copy of said encoded optical clock signal, first means for outputting said encoded optical clock signal, second means for outputting said inverted copy of said encoded optical clock signal, and wherein said encoding means encodes the clock signal with a value derived from an exclusive-or of encoded said first delayed encoded clock signal, and said second delayed inverted encoded clock signal, and wherein a third delay caused by said encoding means from said first and second control means to said first output means is a prespecified time interval;

first delay means for coupling the encoded clock signal from said first output means to said first control means after a first predetermined time interval;

second delay means for coupling the inverted encoded clock signal to said second control means after a second predetermined time interval, said second predetermined time delay being longer than said first predetermined time interval; and register output means for outputting the encoded clock signal.

24. A receiver for use in an optical communication system, comprising an exclusive-or means for decoding a received encoded signal using a code signal generated by an optical linear feedback shift register, and said shift register including encoding means utilizing all-optical interaction, including means for receiving an optical clock signal, first control means for receiving a first delayed version of an encoded optical clock signal, second control means for receiving a second delayed version of said encoded optical clock signal, means for outputting said encoded optical clock signal, and wherein said encoding means encodes the clock signal with a value derived from an exclusive-or of said first and second delayed encoded clock signals, and wherein a third delay caused by said encoding means from said control means to said output means is a prespecified time interval;

first delay means for coupling the encoded clock signal from said output means to said first control means, after a first predetermined time interval;

second delay means for coupling the encoded clock signal to said second control means after a second predetermined time interval; and register output means for outputting the encoded clock signal.

25. A receiver for use in an optical communication system, comprising an exclusive-or means for decoding a received encoded signal using a code signal generated by an optical linear feedback shift register, and said shift register including encoding means utilizing all-optical interaction, including means for receiving an optical clock signal, first control means for receiving a first delayed version of an encoded optical clock signal, second control means for receiving a second delayed version of an inverted copy of said encoded optical clock signal, first means for outputting said encoded optical clock signal, second means for outputting said inverted copy of said encoded optical clock signal, and wherein said encoding means encodes the clock signal with a value derived from an exclusive-or of said first delayed encoded clock signal, and said second delayed inverted encoded clock signal, and wherein a third delay caused by said encoding means from said first and second control means to said first output means is a prespecified time interval;

first delay means for coupling the encoded clock signal from said first output means to said first control means after a first predetermined time interval;

second delay means for coupling the inverted encoded clock signal to said second control means after a second predetermined time interval, said second predetermined time delay being longer than said first predetermined time interval; and register output means for outputting the encoded clock signal.

26. An optical linear feedback shift register comprising a delay medium for producing two outputs corresponding to two different delays of input signals;

a Sagnac loop having a clock signal and two control inputs coupled to said two outputs of said delay medium for generating said input signals; and wherein the polarization of the control signals are different from the polarization of the input signals and the polarization of the input signals is the same as the polarization of the clock signal.

* * * * *